United States Patent
Yoon

(10) Patent No.: US 6,326,822 B1
(45) Date of Patent: Dec. 4, 2001

(54) APPARATUS AND METHOD FOR DRIVING BUS WITH LOW POWER CONSUMPTION

(75) Inventor: Seong-ho Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/642,995

(22) Filed: Aug. 21, 2000

(30) Foreign Application Priority Data

Aug. 31, 1999 (KR) .................................................. 99-36533

(51) Int. Cl.[7] ...................................................... H03B 1/00
(52) U.S. Cl. .............................. 327/112; 327/398; 326/87
(58) Field of Search .................................. 327/108, 111, 327/112, 214, 219, 225, 306, 318, 319, 328, 333, 398, 399, 400, 170; 326/26, 27, 85, 87

(56) References Cited

U.S. PATENT DOCUMENTS

| | | | |
|---|---|---|---|
| 5,362,997 | * 11/1994 | Bloker | 326/64 |
| 5,410,262 | * 4/1995 | Kang | 327/108 |
| 5,512,854 | * 4/1996 | Park | 327/374 |
| 5,537,060 | * 7/1996 | Baek | 326/87 |
| 5,594,374 | * 1/1997 | Oh | 327/108 |
| 5,672,893 | * 9/1997 | Yamamoto et al. | 326/27 |
| 5,760,621 | * 6/1998 | Keeth | 327/112 |
| 5,831,447 | * 11/1998 | Chaw | 326/27 |
| 5,894,238 | * 4/1999 | Chien | 327/112 |
| 6,218,867 | * 4/2001 | Imai et al. | 326/113 |

* cited by examiner

Primary Examiner—Toan Tran
Assistant Examiner—Hai L. Nguyen
(74) Attorney, Agent, or Firm—Mills & Onello, LLP

(57) ABSTRACT

An apparatus for driving a bus with low power consumption, capable of reducing power consumption by reducing the width of the change in the level of a bus driving voltage transmitted through the data bus and a method therefor are provided. In the apparatus for transmitting a first or second bus driving voltage corresponding to input data instead of the input data to a bus receiving apparatus through a data bus, a first voltage transmitter transmits the first bus driving voltage, which corresponds to input data having a high level, to the data bus in response to a first control signal. A second voltage transmitter transmits the second bus driving voltage, which has a level that is lower than the level of the first bus driving voltage by a first predetermined level and corresponds to a low level of the input data, to the data bus in response to the first control signal. A first control signal generator outputs the first control signal in response to the input data. A voltage reducer reduces the first bus driving voltage transmitted to the data bus by a voltage having a level higher than or equal to the first predetermined level in response to the input data and the first control signal when the input data is transited from the high level to the low level.

14 Claims, 9 Drawing Sheets

APPARATUS AND METHOD FOR DRIVING BUS WITH LOW POWER CONSUMPTION

BACKGROUND OF THE INVENTION

1. Field of the Invention

The present invention relates to a system in which a data bus is used, and more particularly, to an apparatus and method for driving a bus with low power consumption.

2. Description of the Related Art

As portable systems such as palm top computers, smart phones, and personal digital assistants are widely used, the demand for integrated circuits with low power consumption is rapidly increasing. This is because it is important to secure a certain level of operation time using restricted power of batteries in portable systems.

At this time, reducing power consumption by a data bus is important to developing the integrated circuits in which low power consumption is required. This is because power consumed in the bus accounts for a considerable amount of power consumed in the entire integrated circuit. In general, a bus driving apparatus generates a bus driving voltage, corresponding to the binary logic level of input data, and transmits the generated bus driving voltage to the bus receiving apparatus through the data bus. At this time, the bus receiving apparatus restores the bus driving voltage received through the data bus to original input data. At this time, the data bus consumes power since a parasitic capacitance of the generally long data bus Cw is charged or discharged whenever the logic level, of the bus driving voltage changes.

In the conventional bus driving apparatus, the width of the change in the level of the bus driving voltage (or the swing width of the bus driving voltage) transmitted to the bus receiving apparatus through the data bus is very large. Therefore, since a large amount of charge is charged or discharged in the parasitic capacitor Cw, power consumption by the data bus becomes larger.

SUMMARY OF THE INVENTION

It is an object of the present invention to provide an apparatus and method for driving a bus with low power consumption, capable of reducing power consumption by reducing the width of the change in a bus driving voltage transmitted through the data bus.

Accordingly, in accordance with the invention, there is provided an apparatus for driving a data bus, in which a first or second bus driving voltage, corresponding to input data, is transmitted to a bus receiving apparatus through a data bus instead of the input data. The apparatus includes a first voltage transmitter for transmitting the first bus driving voltage to the data bus in response to a control signal, the first bus driving voltage corresponding to input data having a high level. A second voltage transmitter transmits the second bus driving voltage to the data bus in response to the control signal, the second bus driving voltage having a level that is lower than the level of the first bus driving voltage by a predetermined difference level and corresponding to a low level of the input data. A control signal generator outputs the control signal in response to the input data. A voltage reducer reduces the first bus driving voltage transmitted to the data bus by a voltage having a level higher than or equal to the predetermined difference level in response to the input data and the control signal when the input data transitions from the high level to the low level.

In one embodiment, the apparatus for driving the bus is included in an integrated circuit together with the data bus.

The first voltage transmitter can include a first PMOS transistor having a gate connected to the control signal and a source and a drain connected to a supply voltage and the data bus, respectively.

The second voltage transmitter can include a first NMOS transistor having a gate connected to the control signal and a drain and a source connected to a supply voltage and the data bus, respectively. The predetermined difference level can correspond to the level of the gate-to-source threshold voltage of the first NMOS transistor. The second voltage transmitter can include second through Mth NMOS transistors, where M is a positive integer larger than or equal to two. The drain and gate of each of these NMOS transistors can be electrically connected to each other. The second NMOS transistor can include a drain connected to the source of the first NMOS transistor. An Xth ($3 \leq X \leq M-1$) NMOS transistor can include a drain and a source connected to the source of an (X−1)th NMOS transistor and the drain of an (X+1)th NMOS transistor, respectively. The Mth NMOS transistor can include a drain and a source connected to the source of the (M−1)th NMOS transistor and the data bus, respectively. The voltage having the predetermined difference level can be obtained by adding the gate-to-source threshold voltages of the first through Mth NMOS transistors to each other.

In one embodiment, the voltage reducer comprises a delay for delaying the control signal for a predetermined time required for reducing the first bus driving voltage transmitted to the data bus by the voltage having the level higher than or equal to the predetermined difference level and outputting the delayed control signal. The voltage reducer also includes OR operation means for performing an OR operation on the delayed control signal obtained by the delay and the input data and outputting the OR operation result. The voltage reducer also includes a second PMOS transistor having a gate connected to the OR operation result and a source and a drain connected to the data bus and a reference voltage, respectively.

In another aspect of the invention, there is provided an apparatus for driving a data bus, in which a first or second bus driving voltage, corresponding to input data, is transmitted to a bus receiving apparatus through a data bus. The apparatus includes a first voltage transmitter for transmitting the first bus driving voltage to the data bus in response to a control signal, the first bus driving voltage corresponding to input data having a low level. A second voltage transmitter transmits the second bus driving voltage to the data bus in response to the control signal, the second bus driving voltage having a level that is higher than the level of the first bus driving voltage by a predetermined difference level and corresponding to a high level of the input data. A control signal generator outputs the control signal in response to the input data. A voltage adder adds a voltage having a level higher than or equal to the predetermined difference level to the first bus driving voltage transmitted to the data bus in response to the input data and the control signal when the input data transitions from the low level to the high level.

In one embodiment of this aspect of the invention, the apparatus for driving the bus is included in an integrated circuit together with the data bus.

The first voltage transmitter can include a first NMOS transistor having a gate connected to the control signal and a drain and a source connected to the data bus and a reference voltage, respectively.

The second voltage transmitter can include a first PMOS transistor having a gate connected to the control signal and a source and a drain connected to the data bus and a reference voltage, respectively. The predetermined difference level can correspond to the level of the source-to-gate threshold voltage of the first PMOS transistor. The second voltage transmitter can include second through Mth PMOS transistors, where M is a positive integer larger than or equal to two. The drain and gate of each of these PMOS transistors can be electrically connected to each other. The second PMOS transistor can include a drain connected to the source of the first PMOS transistor. An Xth (3≦X≦M−1) PMOS transistor can include a drain and a source connected to the source of an (X−1)th PMOS transistor and the drain of an (X+1)th PMOS transistor, respectively. The Mth PMOS transistor can include a drain and a source connected, to the source of the (M−1)th PMOS transistor and the data bus, respectively. The voltage having the predetermined difference level can be obtained by adding the source-to-gate threshold voltages of the first through Mth PMOS transistors to each other.

In one embodiment, the voltage adder comprises a delay for delaying the control signal for a predetermined time required for adding the voltage having the level higher than or equal to the predetermined difference level to the first bus driving voltage transmitted to the data bus and outputting the delayed control signal. The voltage adder also includes AND operation means for performing an AND operation on the delayed control signal obtained by the delay and the input data and outputting the AND operation result. The voltage adder also includes a second NMOS transistor having a gate connected to the AND operation result and a drain and a source connected to a supply voltage and the data bus, respectively.

In accordance with the invention, there is also provided a method for driving a data bus, in which a first or second bus driving voltage corresponding to input data having a high level or a low level is transmitted to a bus receiving apparatus through the data bus instead of the input data. In accordance with the method, the first and second bus driving voltages associated with the high and low levels of the input data are defined. It is determined whether the level of the input data decreases or increases. The level of the first bus driving voltage is defined to be the level of a supply voltage when the level of the input data increases. A reduced bus driving voltage level is generated by reducing the level of the first bus driving voltage transmitted to the data bus by a level higher than or equal to a predetermined level when the level of the input data decreases. The level of the second bus driving voltage is defined to be the level lower than the level of the supply voltage by the predetermined level.

In another aspect of the invention, there is provided another method for driving a data bus, in which a first or second bus driving voltage corresponding to input data having a high level or a low level is transmitted to a bus receiving apparatus through the data bus instead of the input data. In accordance with the invention, the first and second bus driving voltages associated with the high and low levels of the input data are defined. It is determined whether the level of the input data decreases or increases. The level of the first bus driving voltage is defined to be the level of a reference voltage when the level of the input data decreases. An added bus driving voltage level is generated by adding a level higher than or equal to a predetermined level to the first bus driving voltage transmitted to the data bus when the level of the input data increases. The level of the second bus driving voltage is defined to be the level higher than the level of the reference voltage by the predetermined level.

BRIEF DESCRIPTION OF THE DRAWING(S)

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED
EMBODIMENTS OF THE INVENTION

The present invention now will be described more fully with reference to the accompanying drawings, in which preferred embodiments of the invention are shown.

The power (P), represented by Equation 1, consumed by an integrated circuit including a data bus will now be described.

$$P = f \cdot C_W \cdot V_{Swing} \cdot V_{DD} \qquad (1)$$

In Equation 1, f represents the frequency of a bus driving voltage transmitted to a bus receiving apparatus through a data bus (hereinafter, a switching frequency). $C_W$ indicates a parasitic capacitor CW, which represents the parasitic capacitance of a data bus. $V_{swing}$ represents the width of the change in the level of the bus driving voltage, that is, a swing voltage corresponding to the amount of change in charge charged or discharged in the parasitic capacitor $C_W$. $V_{DD}$ represents a supply voltage.

Since the conventional bus driving apparatus has the structure of a simple complementary MOS transistor, the swing voltage $V_{swing}$ is equal to the supply voltage $V_{DD}$. Accordingly, the power P consumed by the integrated circuit having the data bus is represented by Equation 2.

$$P = f \cdot C_W \cdot V_{DD}^2 \qquad (2)$$

It is noted from Equation 1 that the capacitance of the parasitic capacitor $C_W$, the level of the swing voltage $V_{swing}$, and the level of the supply voltage $V_{DD}$ must be reduced in order to reduce the power consumption by the integrated circuit. However, the parasitic capacitance is determined by the length of the data bus, and the supply voltage $V_{DD}$ has a fixed value. Therefore, in the bus driving apparatus according to the present invention, the power consumption of the integrated circuit including the data bus and the bus driving apparatus is reduced by reducing the swing width of the bus driving voltage, which is the swing voltage $V_{swing}$ of the data bus.

Figure 1:
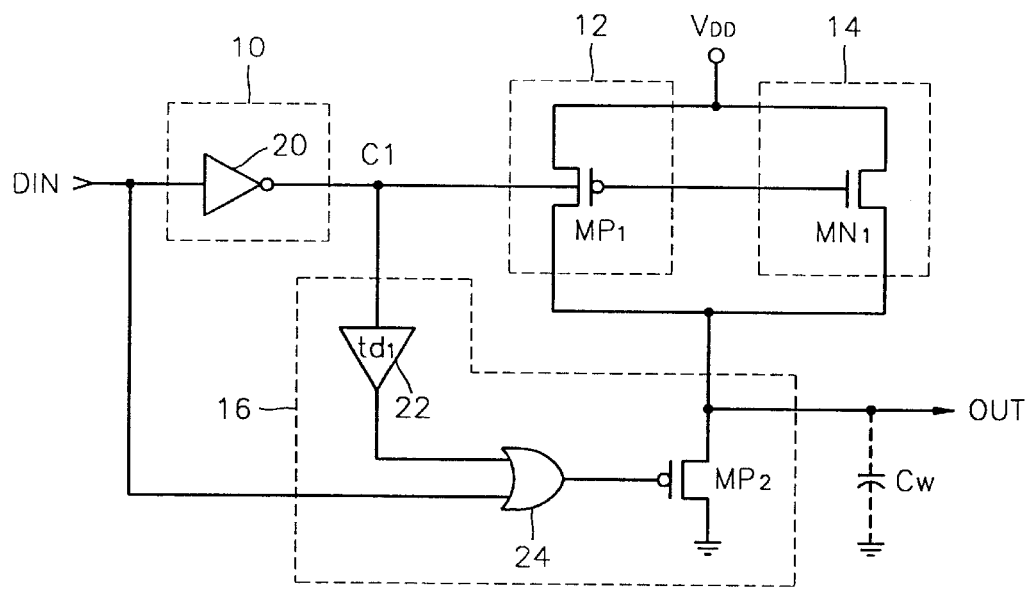
FIG. 1 is a circuit diagram of one embodiment of an apparatus for driving a bus with low power consumption according to the present invention.

FIG. 1 is a circuit diagram of an embodiment of the apparatus for driving the bus with low power consumption according to the present invention. The bus driving apparatus includes a first control signal generator 10, first and second voltage transmitters 12 and 14, and a first voltage reducer 16. The parasitic capacitor CW shown in FIG. 1 is not a discrete device, but is used to represent the parasitic capacitance CW on a line of the data bus. The above capacitors operate as a load of the bus driving apparatus according to the present invention. Therefore, the connections to the parasitic capacitor $C_W$ are marked with a dotted line.

Referring to FIG. 1, the first voltage transmitter 12 transmits the supply voltage $V_{DD}$ as a first bus driving voltage to a bus receiving apparatus (not shown) through an output terminal OUT and the data bus (not shown), in response to a first control signal C1 generated by the first control signal generator 10. At this time, the second voltage transmitter 14 transmits a voltage ($V_{DD}-V_{TN}$) having a level that is lower than the level of the supply voltage $V_{DD}$ by a first predetermined level $V_{TN}$ as a second bus driving voltage to the bus receiving apparatus (not shown) through the output terminal OUT and the data bus (not shown), in response to the first control signal C1. Here, the bus receiving apparatus restores the voltage $V_{DD}$ or $V_{DD}-V_{TN}$ received through the data bus to a voltage $V_{DD}$ or $V_{SS}$ having an original signal level.

The first control signal generator 10 outputs the first control signal C1, which is generated corresponding to the level of input data DIN, to the first and second voltage transmitters 12 and 14 and a first voltage reducer 16.

The first voltage reducer 16 reduces the first bus driving voltage transmitted through the data bus by a voltage higher than or equal to the voltage $V_{TN}$ of the first predetermined level in response to the input data DIN and the first control signal C1. That is, the first voltage reducer 16 sinks the amount of charge corresponding to the voltage that is higher than or equal to the voltage of the first predetermined level from the amount of charge corresponding to the first bus driving voltage charged in the parasitic capacitor $C_W$, in response to the input data DIN and the first control signal C1. Here, the first bus driving voltage output from the first voltage transmitter 12 indicates the voltage that is transmitted to the bus receiving apparatus (not shown) through the data bus instead of the input data DIN of a logic "high" level. The second bus driving voltage output from the second voltage transmitter 14 indicates the voltage that is transmitted to the bus receiving apparatus (not shown) instead of the input data DIN of a logic "low" level.

Figure 2:
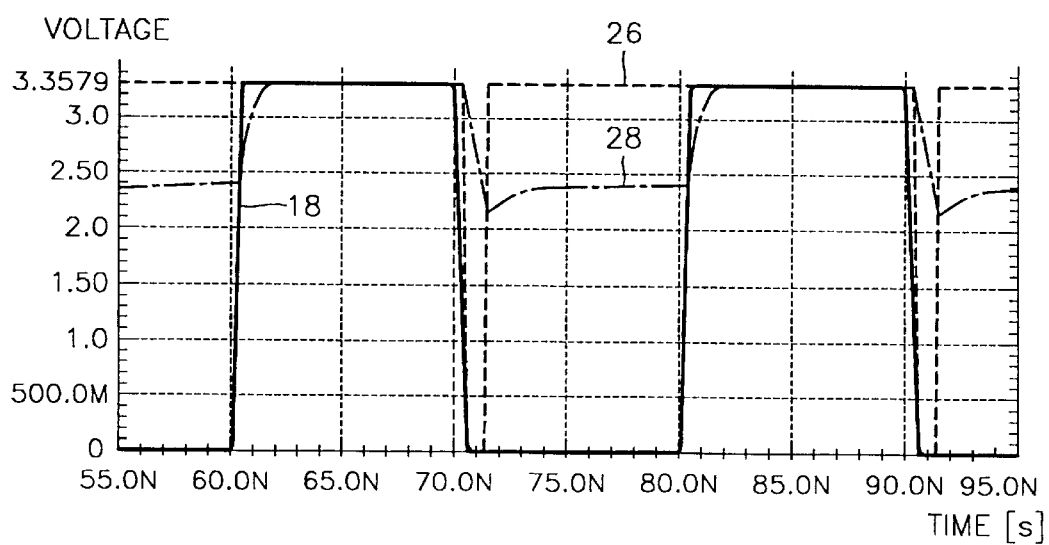
FIG. 2 shows timing diagrams of portions in the bus driving apparatus shown in FIG. 1.

The operation of the bus driving apparatus shown in FIG. 1 will now be described in more detail. FIG. 2 shows timing diagrams of the respective portions of the bus driving apparatus shown in FIG. 1. A solid line 18 shows a timing diagram of the input data DIN. A dotted line 26 shows a timing diagram of the signal applied to the gate of a second PMOS transistor $MP_2$. A dashed line 28 shows a timing diagram of the first or second bus driving voltage output through the output terminal OUT.

The first control signal generator 10 shown in FIG. 1 outputs the first control signal C1 of the logic "low" level when the input data DIN 18 shown in FIG. 2 is at the logic "high" level and outputs the first control signal C1 of the logic "high" level when the input data DIN is at the logic "low" level. In order to do this, the first control signal generator 10 can be realized by an inverter 20 which inverts the input data DIN and outputs the inverted input data as the first control signal C1.

When the input data DIN 18 shown in FIG. 2 is at the logic "high" level, the first voltage transmitter 12 transmits the supply voltage $V_{DD}$, with no change in the level thereof, as the first bus driving voltage to the bus receiving apparatus (not shown) through the output terminal OUT and the data bus (not shown) in response to the first control signal C1 of the logic "low" level. In order to do this, the first voltage transmitter 12 is formed of a first PMOS transistor $MP_1$ which has a gate connected to the first control signal C1 and a source and a drain connected to the supply voltage $V_{DD}$ and the output terminal OUT, respectively. Here, when the first PMOS transistor $MP_1$ is turned on, the first voltage transmitter 12 transmits the voltage $V_{DD}$ of the source thereof, with no change in level, to the drain thereof. Therefore, the supply voltage $V_{DD}$, the level of which is not changed, can be charged in the parasitic capacitance $C_W$ through the turned-on first PMOS transistor $MP_1$. Here, the voltage $V_{DD}$ charged in the parasitic capacitor $C_W$ as the first bus driving voltage 28 is transmitted to the bus receiving apparatus through the output terminal OUT and the data bus, as shown in FIG. 2.

If the input data DIN transitions from the logic "high" level $V_{DD}$ to the logic "low" level $V_{SS}$ the first voltage reducer 16 turns on the second PMOS transistor $MP_2$ for a predetermined time $t_{d1}$ at the falling edge of the input data DIN 18 shown in FIG. 2. This is for sinking the charge corresponding to the voltage that is higher than or equal to the voltage $V_{TN}$ of the first predetermined level from the first bus driving voltage $V_{DD}$ charged in the parasitic capacitor $C_W$, through the turned-on second PMOS transistor $MP_2$. To achieve this, the first voltage reducer 16 includes a delay 22, an OR gate 24, and the second PMOS transistor $MP_2$. The delay 22 delays the first control signal C1 of the logic "high" level for the first predetermined time $t_{d1}$ and outputs the delayed first control signal C1 to the OR gate 24. Therefore, the OR gate 24 performs an OR operation on the signal of the logic "low" level output from the delay 22 and the input data DIN of the logic "low" level for the first predetermined time $T_{d1}$ and outputs the OR operation result 26 shown in FIG. 2 to the gate of the second PMOS transistor $MP_2$. Therefore, the second PMOS transistor MP2, the gate of which is connected to the OR operation result 26 and the source and the drain of which are connected to the output terminal OUT and ground, which is the reference voltage, is turned on for the first predetermined time $t_{d1}$ and sinks the voltage higher than or equal to the voltage of the first predetermined level from the voltage charged in the parasitic capacitor $C_W$. Here, the first predetermined time $t_{d1}$ indicates the time required for reducing the voltage charged in the parasitic capacitor $C_W$ from the supply voltage $V_{DD}$ to the voltage less than or equal to $V_{DD}-V_{TN}$.

The second voltage transmitter 14 reduces the level of the supply voltage $V_{DD}$ by the first predetermined level $V_{TN}$ in response to the first control signal C1 of the logic "high" level $V_{DD}$ and transmits the voltage $V_{DD}-V_{TN}$ having a reduced level as the second bus driving voltage 28 to the bus receiving apparatus through the output terminal OUT and the data bus (not shown). The voltage $V_{TN}$ having the first predetermined level indicates the gate-to-source threshold voltage of the first NMOS transistor $MN_1$. Therefore, according to the characteristic of the turned-on first NMOS transistor $MN_1$, the voltage $V_{DD}-V_{TN}$ 28, whose level is reduced from the drain voltage $V_{DD}$ of the first NMOS transistor $MN_1$ by the threshold voltage $V_{TN}$, can be transmitted to the source of the first, NMOS transistor $MN_1$. Namely, after the supply voltage $V_{DD}$ charged in the parasitic capacitor $C_W$ is reduced by the voltage higher than or equal to the voltage $V_{TN}$ of the first predetermined level by the first voltage reducer 16, a second bus driving voltage $V_{DD}-V_{TN}$, whose level is lower than the level of the supply voltage $V_{DD}$ by the first predetermined level $V_{TN}$, is supplied from the second voltage transmitter 14 to the parasitic capacitor $C_W$.

Figure 3A:
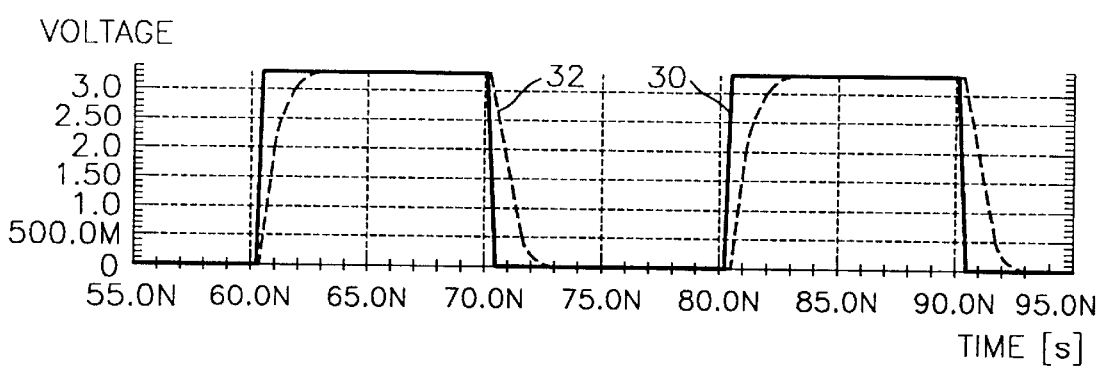
FIGS. 3A and 3B show waveforms illustrating the swing widths of bus driving voltages according to a conventional technology and according to the present invention, respectively.
Figure 3B:
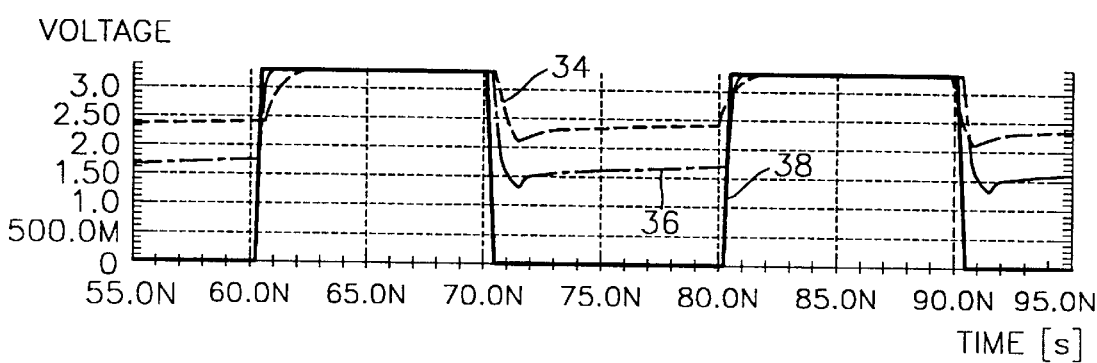

FIGS. 3A and 3B show waveforms illustrating the swing widths of the bus driving voltages according to the conventional technology and the present invention. FIG. 3A shows the waveform of a bus driving voltage generated by the conventional bus driving apparatus. FIG. 3B shows the waveform of the bus driving voltage generated by a bus driving apparatus according to the present invention.

As shown in FIG. 3A, the conventional bus driving apparatus outputs a bus driving voltage 32 of the logic "high" level $V_{DD}$ when input data 30 is at the logic "high" level $V_{DD}$ and outputs a bus driving voltage 32 of the logic "low" level $V_{SS}$ when the input data 30 is at the logic "low" level $V_{SS}$. Therefore, the swing width of the bus driving voltage output from the conventional bus driving apparatus is $V_{DD}-V_{SS}$. However, when input data DIN 38 is at the logic "high" level $V_{DD}$, the bus driving apparatus according to the present invention shown in FIG. 1 outputs the first bus driving voltage of the logic "high" level $V_{DD}$. When the input data DIN 38 is at the logic "low" level $V_{SS}$, the bus driving apparatus show in FIG. 1 outputs a second bus driving voltage 34 of the logic "low" level $V_{DD}-V_{TN}$. Therefore, the swing width of the bus driving voltage output from the bus driving apparatus according to the present invention is $V_{TN}$ as shown in FIG. 3B. Namely, the swing width of the bus driving apparatus according to the present invention shown in FIG. 1 is $V_{DD}-V_{TN}-V_{SS}$ less than the swing width of the conventional bus driving apparatus. Therefore, the amount of charge charged or discharged in the capacitor $C_W$ is smaller than the amount of charge charged or discharged in the capacitor $C_W$ in the conventional technology. Accordingly, it is possible to significantly reduce the power consumption of the data bus.

When the swing width $V_{TN}$ of the bus driving voltage is small as mentioned before, the bus driving voltage can be affected by noise during the process of transmitting the bus driving voltage to the bus receiving apparatus through the data bus. Therefore, it is possible to realize the bus driving apparatus as described below in order to increase noise immunity.

Figure 4:
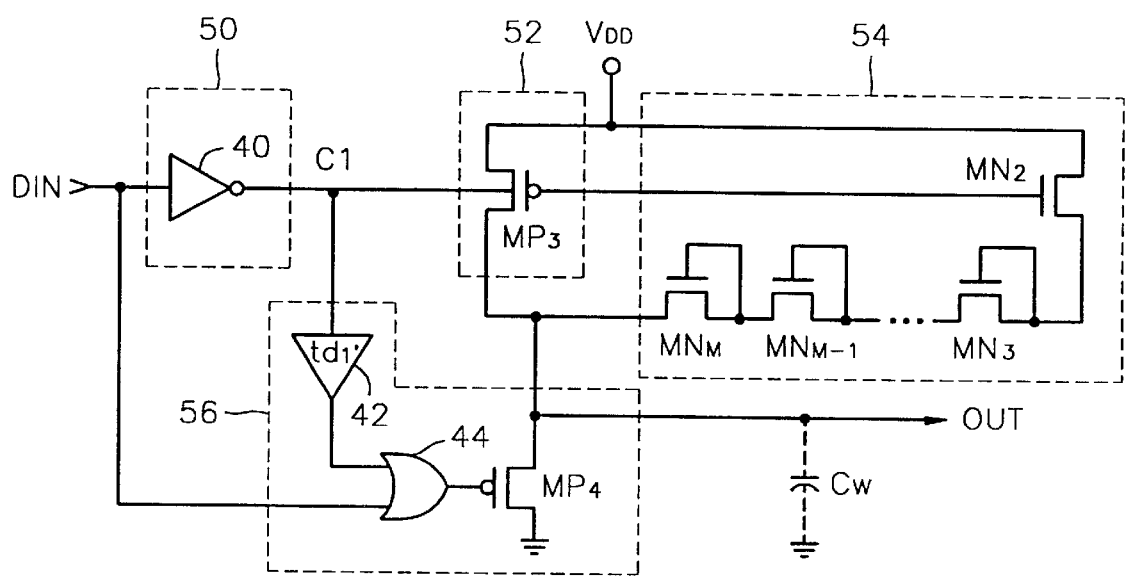
FIG. 4 is a circuit diagram of a modification according to the present invention of the bus driving apparatus shown in FIG. 1.

FIG. 4 is a circuit diagram of a modification according to the present invention of the bus driving apparatus shown in FIG. 1. The bus driving apparatus includes a second control signal generator 50, third and fourth voltage transmitters 52 and 54, and a second voltage reducer 56.

The second control signal generator 50, the third voltage transmitter 52, and the second voltage reducer 56 have the same structures and perform the same functions as the first control signal generator 10, the first voltage transmitter 12, and the first voltage reducer 16, which are shown in FIG. 1. An inverter 40, an OR gate 44, a delay 42, and a fourth PMOS transistor $MP_4$, which are shown in FIG. 4, correspond to and perform the same functions as the inverter 20, the OR gate 24, the delay 22, and the second PMOS transistor $MP_2$, which are shown in FIG. 1. Therefore, descriptions of the inverter 40, the OR gate 44 the delay 42, and the fourth PMOS transistor $MP_4$ will be omitted. Time $t_{d1}$ taken for the delay 42 to delay the first control signal C1 is different from time $t_{d1}$ taken for the delay 22 to delay the first control signal C1. The difference between the two will now be described. The fourth voltage transmitter 54 shown in FIG. 4 further includes third through Mth ($3 \leq M \leq 5$) NMOS transistors $MN_3, \ldots, MN_{M-1}$, and $MN_M$, unlike the second voltage transmitter 14 shown in FIG. 1. Here, the reason why M must be smaller than or equal to 5, that is, the reason why the number of NMOS transistors required by the fourth voltage transmitter 54 must be smaller than or equal to 4 is because $(M-1)*V_{TN}$ [$V_{TN}$ corresponds to the gate-to-source threshold voltage of each of the second, third, ..., and Mth NMOS transistors $MN_2, MN_3, \ldots$, and $MN_M$.] can be larger than the peak-to-peak level of the input data DIN. Here, the drains and the gates of the third through Mth NMOS transistors $MN_3, \ldots, MN_{N-1}$, and $MN_M$ are connected to each other. The drain of the third NMOS transistor $MN_3$ is connected to the source of the second NMOS transistor $MN_2$. The drain and the source of an Xth ($4 \leq X \leq M-1$) NMOS transistor are connected to the source of the (X-1)th NMOS transistor and the drain of the (X+1) NMOS transistor, respectively. The drain and the source of the Mth NMOS transistor $MN_M$ are connected to the source of the (M-1)th NMOS transistor $MN_{M-1}$ and the output terminal OUT, respectively. At this time, the voltage having the first predetermined level is obtained by adding the gate-to-source threshold voltages of the second through Mth NMOS transistors $MN_2, MN_3, \ldots, MN_{M-1}$, and $MN_M$ to each other.

The operation of the apparatus shown in FIG. 4 will now be described. When the input data DIN of the logic "high" level is input, the third PMOS transistor $MP_3$ of the third voltage transmitter 52 is turned on and the supply voltage $V_{DD}$ as the first bus driving voltage is output to the bus receiving apparatus through the output terminal OUT and the data bus, like in the apparatus shown in FIG. 1. However, when the input data DIN 38 shown in FIG. 3B is transited from the logic "high" level to the logic "low" level, the delay 42 shown in FIG. 4 delays the first control signal C1 for the first predetermined time $t_{d1}$ and outputs the delay result to the OR gate 44. Here, the first predetermined time $t_{d1}$ means the time required for reducing the voltage charged in the parasitic capacitor $C_W$ from the supply voltage $V_{DD}$ to the voltage lower than or equal to $V_{DD}-(M-1)*V_{TN}$. At this time, all the NMOS transistors of the fourth voltage transmitter 54 are turned on. Accordingly, the fourth voltage transmitter 54 transmits a voltage obtained by reducing the supply voltage $V_{DD}$ by the first predetermined level $(M-1)*V_{TN}$ as the second bus driving voltage through the output terminal OUT. For example, when M is 3, when the input data DIN 38 of the logic "low" level is input, the fourth voltage transmitter 54 transmits the voltage reduced by 2*$V_{TN}$ as the second bus driving voltage 36 through the output terminal OUT as shown in FIG. 3B.

The swing width of the bus driving voltage output from the bus driving apparatus according to the present invention shown in FIG. 4 is (M−1)*$V_{TN}$, which is larger than the swing width $V_{TN}$ of the bus driving voltage output from the bus driving apparatus shown in FIG. 1. However, the bus driving voltage output from the bus driving apparatus according to the present invention is affected by noise much less than the bus driving voltage output from the bus driving apparatus shown in FIG. 1. Therefore, the bus driving apparatus shown in FIG. 1 or 4 can be selectively applied according to whether what is important to the bus driving apparatus is the influence of noise or the influence of power consumption. Also, it is noted that the swing width of the bus driving apparatus according to the present invention shown in FIG. 4 is $V_{DD}$−(M−1)*$V_{TN}$−$V_{SS}$ less than the swing width of the conventional bus driving apparatus. Therefore, since the amount of charge charged or discharged in the parasitic capacitor $C_W$ is smaller than in the conventional technology, it is possible to significantly reduce the power consumption by the data bus.

Figure 5:
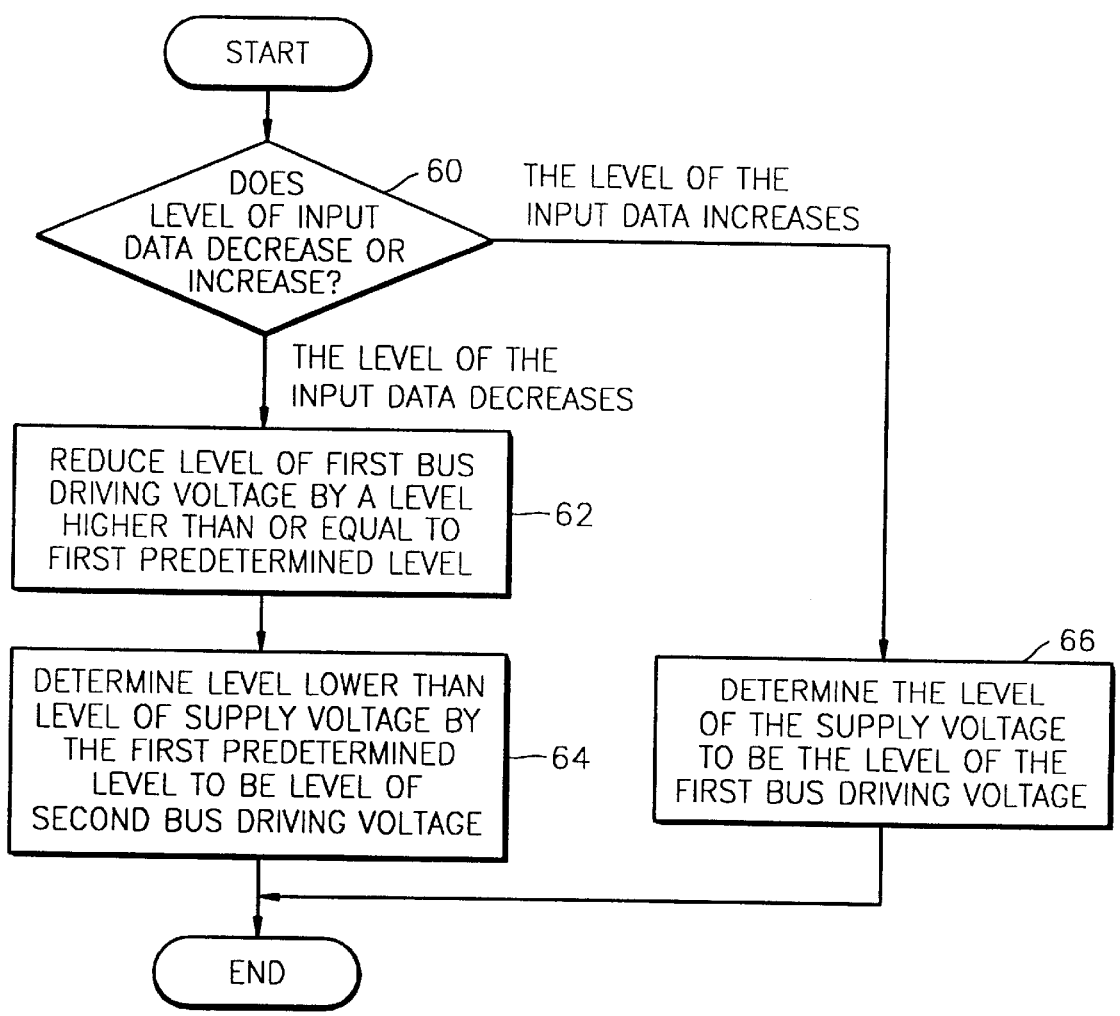
FIG. 5 is a flowchart illustrating a method for driving a bus according to the present invention, which can be performed by the bus driving apparatus shown in FIG. 1 or FIG. 4.

The method for driving the bus with low power consumption according to the present invention, which is performed by the apparatus shown in FIG. 1 or 4 will now be described with reference to the attached drawings. FIG. 5 is a flowchart for describing the bus driving method according to the present invention, which is performed by the apparatus shown in FIG. 1 or 4. The bus driving method includes steps (steps 60 through 66) for determining the level of the bus driving voltage according to the change in the level of the input data DIN.

Referring to FIG. 5, the control signal generator 10 or 50 shown in FIG. 1 or 4 determines whether the level of the input data DIN increases or decreases and outputs the first control signal C1, which is the determination result, to the first or third voltage transmitter 12 or 52, the second or fourth voltage transmitter 14 or 54, and the first or second voltage reducer 16 or 56 (step 60).

If the level of the input data DIN increases, that is, if the input data DIN 38 shown in FIG. 3B transitions from the logic "low" level $V_{SS}$ to the logic "high" level $V_{DD}$, the level of the supply voltage $V_{DD}$ is determined to be the level of the first bus driving voltage (step 66). Here, the first bus driving voltage $V_{DD}$ having the determined level corresponding to the input data DIN having a high level is transmitted to the bus receiving apparatus (not shown) through the data bus (not shown) instead of the input data DIN of the logic "high" level.

However, if the level of the input data DIN decreases, that is, if the input data DIN shown in FIG. 3B transitions from the logic "high" level $V_{DD}$ to the logic "low" level $V_{SS}$, the first or second voltage reducer 16 or 56 reduces the level of the first bus driving voltage $V_{DD}$ stored in the parasitic capacitor $C_W$ and transmitted through the data bus by the level higher than or equal to the first predetermined level $V_{TN}$ or (M−1)*$V_{TN}$ for the first predetermined time $t_{d1}$ or $t_{d1}$ (step 62). After the step 62, the level of the supply voltage $V_{DD}$−$V_{TN}$ or $V_{DD}$−(M−1)*$V_{TN}$ transmitted from the second or fourth voltage transmitter 14 or 54, which is lower than the first bus driving voltage $V_{DD}$ by the first predetermined level $V_{TN}$ or (M−1)*$V_{TN}$, is determined to be the level of the second bus driving voltage (step 64).

Figure 6:
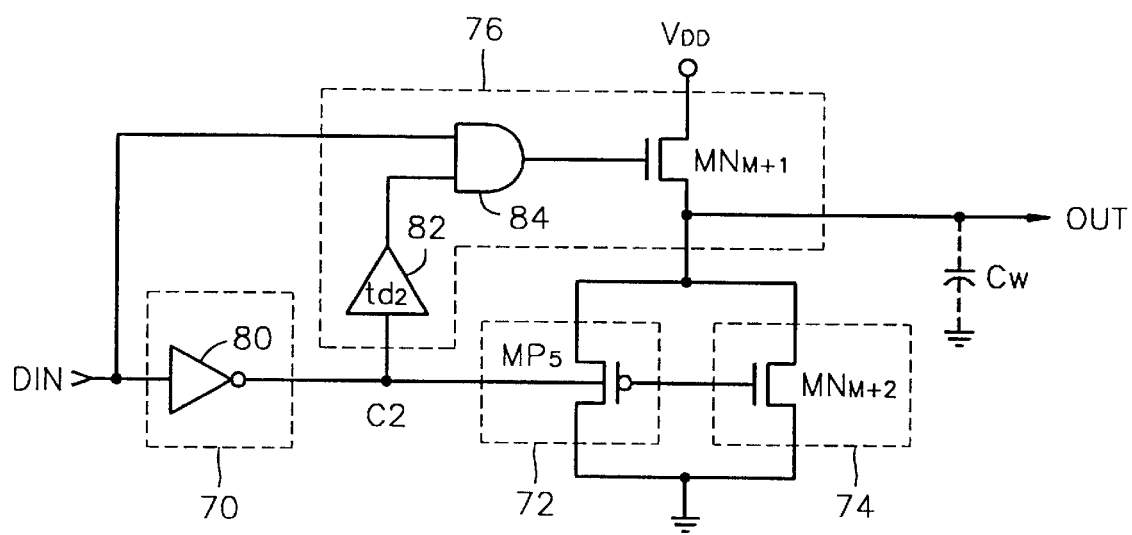
FIG. 6 is a circuit diagram of another embodiment of the apparatus for driving the bus according to the present invention.

The structure and the operation of another embodiment of the bus driving apparatus according to the present invention will now be described. FIG. 6 is a circuit diagram of another embodiment of the bus driving apparatus according to the present invention. The bus driving apparatus includes a third control signal generator 70, a fifth voltage transmitter 72, a sixth-voltage transmitter 74, and a first voltage adder 76.

The sixth voltage transmitter 74 shown in FIG. 6 transmits a third bus driving voltage corresponding to the input data DIN having a low level to the bus receiving apparatus (not shown) through the output terminal OUT and the data bus in response to a second control signal C2. To achieve this, the sixth voltage transmitter 74 can be realized by a (M+2)th NMOS transistor $MN_{M+2}$, the gate of which is connected to the second control signal C2 and a drain and a source of which are connected to the output terminal OUT and the reference voltage $V_{SS}$, respectively.

The fifth voltage transmitter 72 has a level higher than the level $V_{SS}$ of the third bus driving voltage by a second predetermined level |$V_{TP}$|[|$V_{TP}$| corresponds to the absolute value of the level of the source-to-gate threshold voltage of a fifth PMOS transistor $MP_5$.] and transmits a fourth bus driving voltage corresponding to the input data DIN having the high level to the bus receiving apparatus (not shown) through the output terminal OUT and the data bus in response to the second control signal C2. To achieve this, the fifth voltage transmitter 72 can be realized by the fifth PMOS transistor $MP_5$ the gate of which is connected to the second control signal C2 and a source and a drain of which are connected to the output terminal OUT and the reference voltage $V_{SS}$, respectively.

The third control signal generator 70 outputs the second control signal C2 generated in response to the input data DIN to the fifth and sixth voltage transmitters 72 and 74 and the first voltage adder 76. To achieve this, the third control signal generator 70 can be realized by an inverter 80 which inverts the input data DIN and outputs the inversion result as the second control signal C2.

The first voltage adder 76 adds a voltage having a level higher than or equal to the second predetermined level to the third bus driving voltage transmitted to the bus receiving apparatus (not shown) through the data bus in response to the input data DIN and the second control signal C2 when the input data DIN transitions from the logic "low" level to the logic "high" level. To achieve this, the first voltage adder 76 includes a delay 82, an AND gate 84, and a (M+1)th NMOS transistor $MN_{M+1}$. Here, the delay 82 delays the second control signal C2 for a second predetermined time $t_{d2}$ required for adding a voltage, whose level is higher than or equal to the second predetermined level |$V_{TP}$|, to the third bus driving voltage transmitted to the data bus and outputs the delayed second control signal C2. The AND gate 84 performs an AND operation on the delay result obtained by the delay 82 and the input data DIN and outputs the AND operation result to the gate of the (M+1)th NMOS transistor $MN_{M+1}$. The (M+1)th NMOS transistor $MN_{M+1}$, which has a gate connected to the AND operation result obtained by the AND gate 84 and a drain and a source connected to the supply voltage $V_{DD}$ and the output terminal OUT, charges the charge corresponding to the voltage whose level is higher than or equal to the second predetermined level |$V_{TP}$| in the parasitic capacitor $C_W$ in response to the AND operation result input to the gate thereof.

Figure 7:
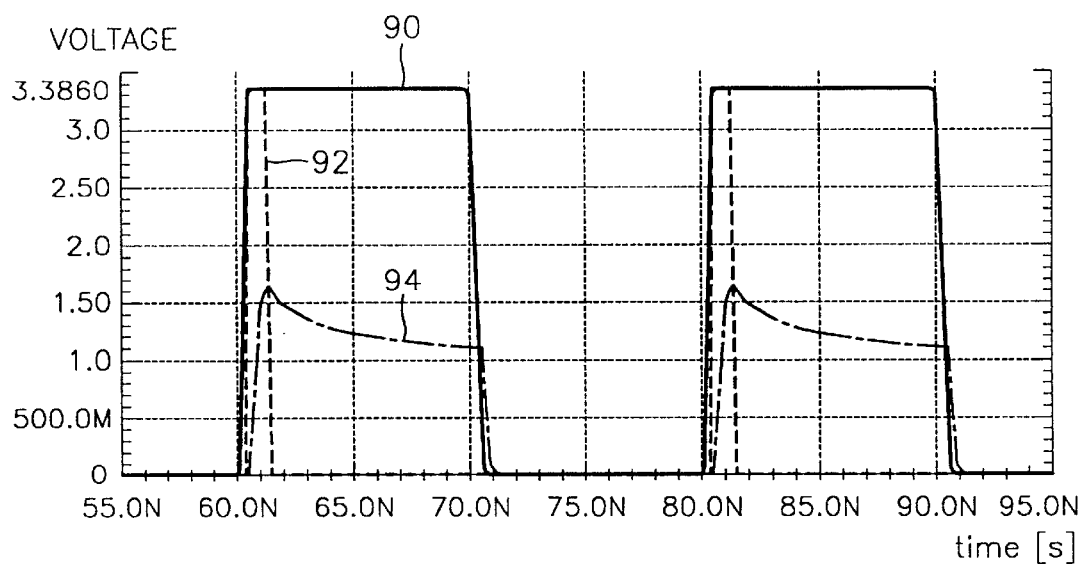
FIG. 7 shows timing diagrams of portions of the bus driving apparatus shown in FIG. 6.

FIG. 7 shows timing diagrams of portions of the bus driving apparatus shown in FIG. 6. A solid line 90 shows a timing diagram of the input data DIN. A dotted line 92 shows a timing diagram of the signal applied to the gate of the (M+1)th NMOS transistor $MN_{M+1}$. A dashed line 94 shows a timing diagram of a third or fourth bus driving voltage output through the output terminal OUT.

When the input data DIN 90 of the logic "low" level shown FIG. 7 is input to the apparatus shown in FIG. 6, the second control signal C2 of the logic "high" level is generated. Therefore, the fifth PMOS transistor MP$_5$ is turned off and a second (M+2) NMOS transistor MN$_{M+2}$ is turned on, in response to the second control signal C2 of the logic "high" level. Therefore, according to the characteristic of the NMOS transistor, the reference voltage V$_{SS}$ of the drain as the third bus driving voltage 94 is transmitted to the bus receiving apparatus (not shown) through the output terminal OUT and the data bus in a state that the (M+2)th NMOS transistor MN$_{M+2}$ is turned on.

However, when the input data DIN 90 of the logic "high" level is input to the apparatus shown in FIG. 6, even though the second control signal C2 of the logic "low" level is generated, the delay 82 outputs a signal of the logic "high" level to the AND gate 84 for the second predetermined time t$_{d2}$. Therefore, the (M+1)th NMOS transistor MN$_{M+1}$ can be maintained to be turned on for the second predetermined time t$_{d2}$ since the voltage 92 of the logic "high" level shown in FIG. 7 is applied to the gate thereof. Accordingly, the charge corresponding to a voltage whose level is higher than or equal to the second predetermined level $|V_{TP}|$ can be charged in the parasitic capacitor C$_W$. Here, the fifth PMOS transistor MP$_5$ is turned on and the (M+2)th NMOS transistor MN$_{M+2}$ is turned off, in response to the second control signal C2 of the logic "low" level. Therefore, due to the characteristic of the PMOS transistor, a voltage having a level higher than the level of the reference voltage V$_{SS}$ by the second predetermined level $|V_{TP}|$ as the fourth bus driving voltage 94 can be transmitted to the bus receiving apparatus (not shown) through the output terminal OUT and the data bus in a state that the fifth PMOS transistor MP$_5$ is turned on.

Figure 8:
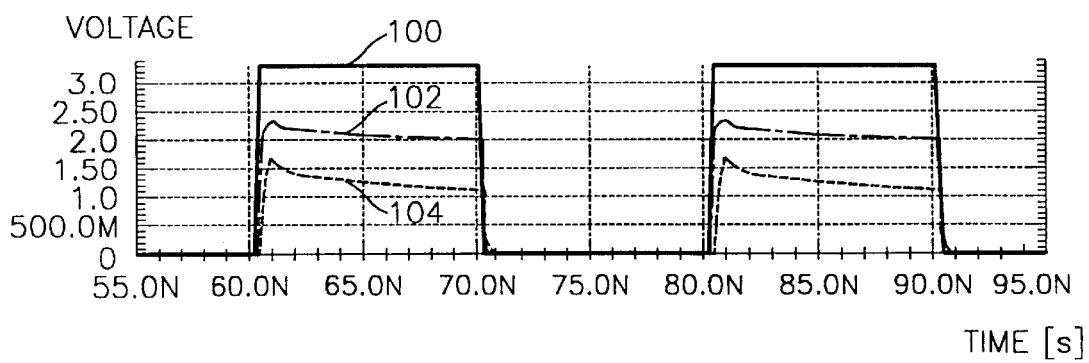
FIG. 8 shows waveforms illustrating the swing width of the bus driving voltage according to the present invention.

FIG. 8 shows waveforms illustrating the swing width of the bus driving voltage according to the present invention. A solid line 100 shows the waveform of the input data DIN. A dashed line shows the waveform of the third or fourth bus driving voltage.

The swing width of a bus driving voltage output from a conventional bus driving apparatus is V$_{DD}$-V$_{SS}$ as mentioned before. However, the bus driving apparatus according to the present invention shown in FIG. 6 outputs a fourth bus driving voltage 104 having a level higher than the level of the reference voltage V$_{SS}$ by the second predetermined level $|V_{TP}|$ when input data DIN 100 is at the logic "high" level and outputs the fourth bus driving voltage 104 of the logic "low" level V$_{SS}$ when the input data DIN 100 is at the logic "low" level V$_{SS}$. The swing width of the bus driving voltage output from the bus driving apparatus according to the present invention shown in FIG. 6 is $|V_{TP}|$, which is V$_{DD}$-$|V_{TP}|$-V$_{SS}$ less than the swing width of the bus driving voltage output from the conventional bus driving apparatus. Therefore, since the amount of charge charged or discharged in the capacitor C$_W$ is smaller than in the conventional technology, the power consumption by the data bus is significantly reduced.

When the swing width $|V_{TP}|$ of the bus driving voltage is small, the bus driving voltage can be affected by noise in a process of transmitting the same. Therefore, in order to increase the noise immunity, the bus driving apparatus can be realized in accordance with the following description.

Figure 9:
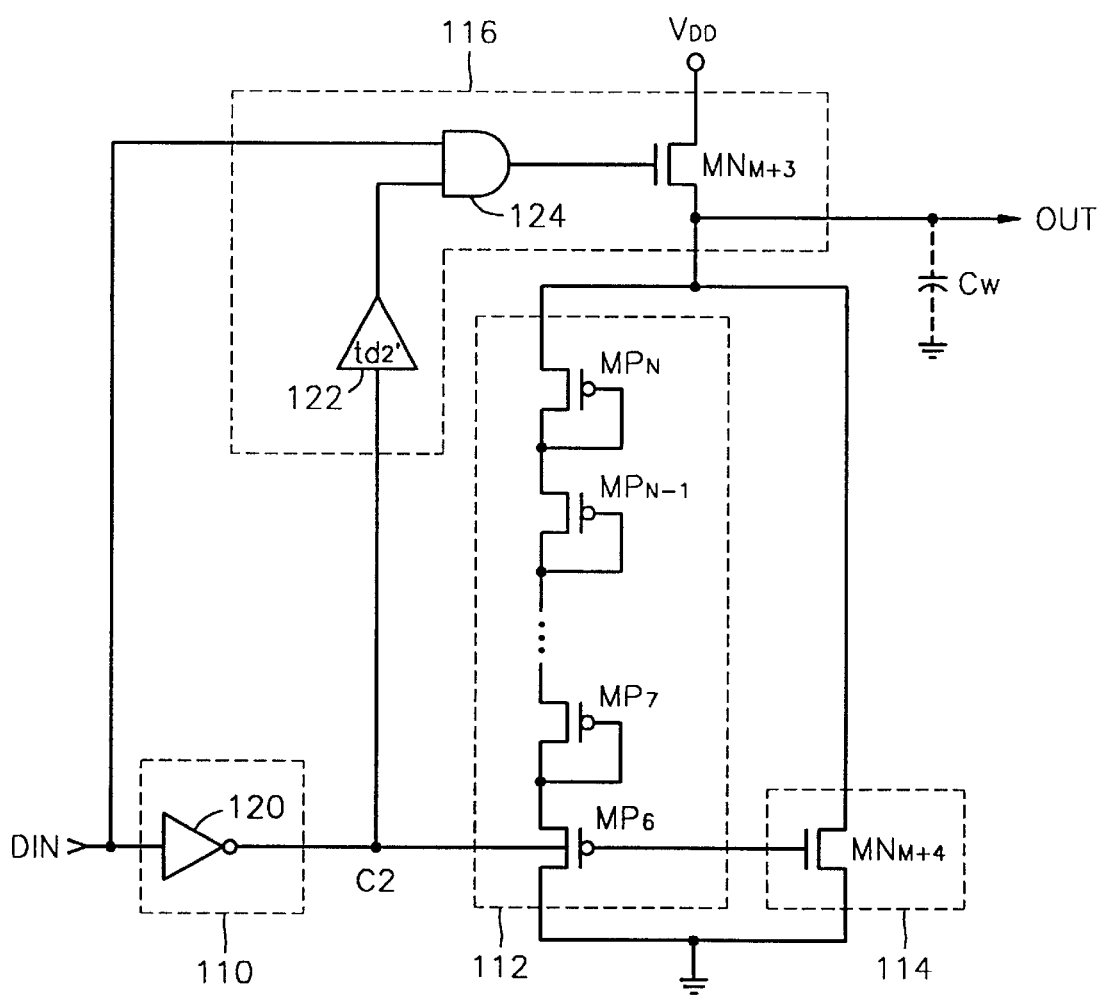
FIG. 9 is a circuit diagram of a modification according to the present invention of the bus driving apparatus shown in FIG. 6.

FIG. 9 is a circuit diagram of a modification according to the present invention of the apparatus shown in FIG. 6. The apparatus includes a fourth control signal generator 110, a seventh voltage transmitter 112, an eighth voltage transmitter 114, and a second voltage adder 116.

The fourth control signal generator 110, the eighth voltage transmitter 114, and the second voltage adder 116 have the same structures and perform the same functions as the third control signal generator 70, the sixth voltage transmitter 74, and the first voltage adder 76, which are shown in FIG. 6. Therefore, an inverter 120, a delay 122, an AND gate 124, and an (N+3)th NMOS transistor MN$_{M+3}$, which are shown in FIG. 9, correspond to and perform the same functions as the inverter 80, the delay 82, the AND gate 84, and the (N+1)th NMOS transistor MN$_{N+1}$, which are shown in FIG. 6. Time t$_{d2}$ taken for the delay 122 shown in FIG. 9 to delay the second control signal C2 is different from time t$_{d2}$ taken for the delay 82 to delay the second control signal C2. The difference between the two will now be described. The seventh voltage transmitter 112 further includes seventh through Nth (7≦N≦9) PMOS transistors iMP$_7$, ..., MP$_{N-1}$, and MP$_N$, unlike the fifth voltage transmitter 72 shown in FIG. 6. Here, the reason why N must be smaller than or equal to 9, that is, the reason why the number of PMOS transistors MP$_6$, MP$_7$, ..., MP$_{N-1}$, and MP$_N$ required by the seventh voltage transmitter 112 must be smaller than or equal to 4 is because.(N-5)* $|V_{TP}|$ [$|V_{TP}|$ corresponds to the gate-to-source threshold voltage of each of the sixth, seventh, ..., (N-1)th, and Nth PMOS transistors MP$_6$, MP$_7$, ..., MP$_{N-1}$, and MP$_N$.] can be larger than the peak-to-peak level of the input data DIN. Here, the drains and the gates of the seventh through Nth PMOS transistors MP$_7$, ..., MP$_{N-1}$, and MP$_N$ are connected to each other. The drain and the source of the seventh PMOS transistor MP$_7$ are respectively connected to the source of the sixth PMOS transistor MP$_6$ and the drain of the eighth PMOS transistor. The source and the drain of a Yth (8≦Y≦N-1) PMOS transistor are connected to the drain of a (Y+1)th PMOS transistor and the source of a (Y-1)th PMOS transistor, respectively. The Nth PMOS transistor MP$_N$ has the source and the drain which are connected to the output terminal OUT and the source of the (N-1)th PMOS transistor MP$_N$, respectively. At this time, the voltage having the second predetermined level is obtained by adding the source-to-gate threshold voltages $|V_{TP}|$ of the sixth through Nth PMOS transistors MP$_6$, MP$_7$, ..., MP$_{N-1}$, and MP$_N$ to each other.

The operation of the apparatus shown in FIG. 9 will now be described. When the input data DIN 100 is at the logic "low" level, only a (M+4) NMOS transistor MN$_{M+4}$ is turned on and the remaining transistors MP$_6$, ..., MP$_N$, and MP$_{N+3}$ are turned off in response to the second control signal C2 of the logic "high" level, like in the apparatus shown in FIG. 6. Therefore, the reference voltage V$_{SS}$ transmitted from the eighth voltage transmitter 114 as the third bus driving voltage is transmitted to the bus receiving apparatus through the output terminal OUT and the data bus.

However, when the input data DIN transitions from the logic "low" level to the logic "high" level, the delay 122 shown in FIG. 9 delays the second control signal C2 for the second predetermined time t$_{d2'}$ and outputs the delay result to the AND gate 124. Here, the second predetermined time t$_{d2'}$ indicates the time required for charging a voltage whose level is higher than or equal to the second predetermined level (N-5)* $|V_{TP}|$ in the parasitic capacitor C$_W$. Therefore, a fourth bus driving voltage having a level larger than the level of the reference voltage V$_{SS}$ by the second predetermined level (N-5)* $|V_{TP}|$ is transmitted to the bus receiving apparatus (not shown) through the output terminal OUT and the data bus. For example, when N is 7 and the input data DIN 100 transitions from the logic "low" level to the logic "high" level, the source bus driving voltage 102 having a level higher than the level of the reference voltage V$_{SS}$ by the second predetermined level (N-5)* $|V_{TP}|$ is transmitted to the bus receiving apparatus (not shown) through the output terminal OUT and the data bus.

The swing width of the apparatus shown in FIG. 9 is $(N-5)*|V_{TP}|$, which is larger than the swing width $|V_{TP}|$ of the apparatus shown in FIG. 6. However, the bus driving voltage output from the bus driving apparatus shown in FIG. 9 is affected by noise much less than the bus driving voltage output from the bus driving apparatus shown in FIG. 6. Therefore, the bus driving apparatus shown in FIG. 6 or 9 can be selectively applied according to whether what is important to the bus driving apparatus is the influence of noise or the influence of power consumption. Also, it is noted that the swing width of the bus driving apparatus according to the present invention shown in FIG. 9 is $V_{DD}-(n-5)*|V_{TP}|-V_{SS}$ less than the swing width $V_{DD}-V_{SS}$ of the conventional bus driving apparatus. Therefore, since the amount of charge charged or discharged in the parasitic capacitor $C_W$ is smaller than in the conventional technology, it is possible to significantly reduce the power consumption by the data bus.

Figure 10:
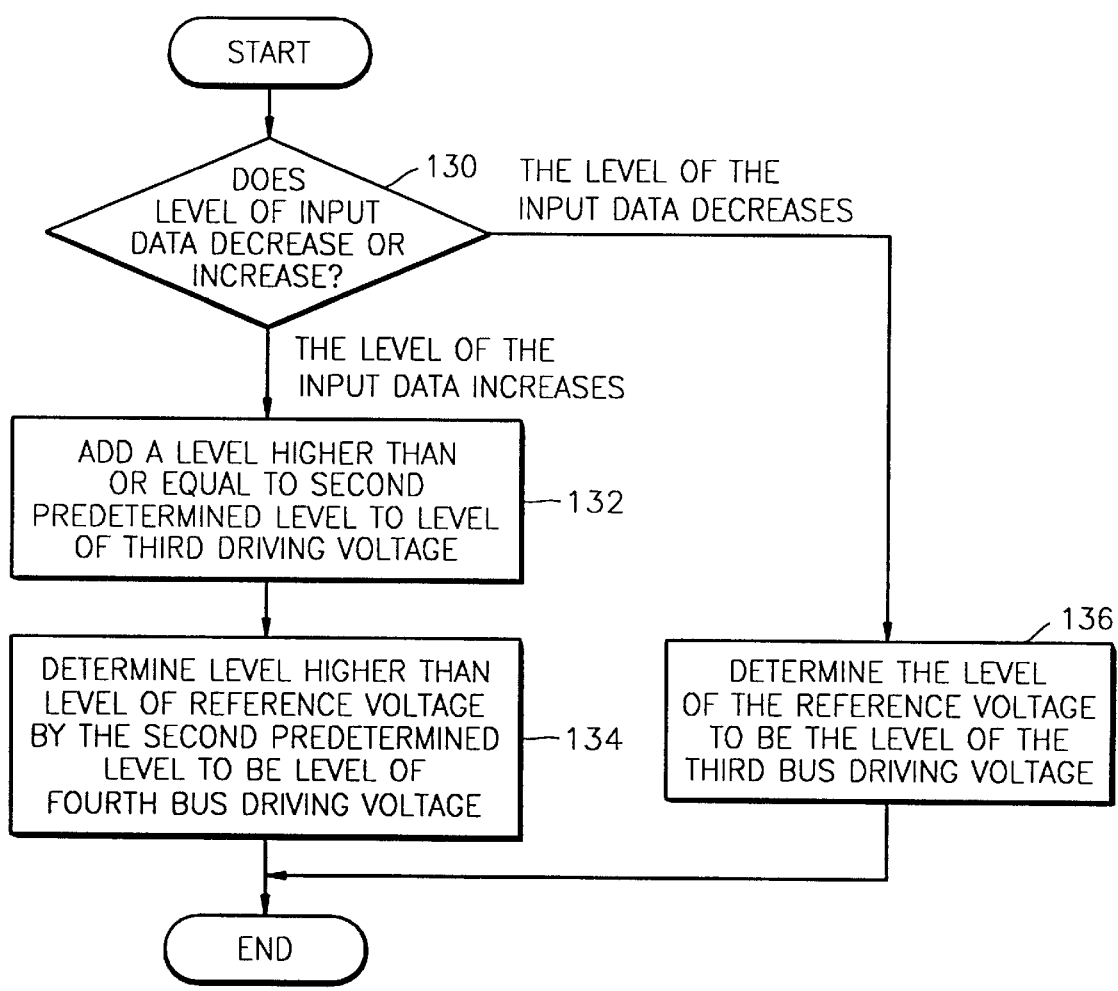
FIG. 10 is a flowchart illustrating the method for driving the bus according to the present invention, which can be performed by the bus driving apparatus shown in FIG. 6 or 9.

The method for driving the bus with low power consumption according to the present invention, which is performed by the apparatus shown in FIG. 6 or 9 will now be described with reference to the attached drawings. FIG. 10 is a flowchart for describing the bus driving method according to the present invention, which is performed by the apparatus shown in FIG. 6 or 9. The bus driving method includes steps (steps 130 through 136) for determining the level of the bus driving voltage according to the change in the level of the input data DIN.

Referring to FIG. 10, the third or fourth control signal generator 70 or 110 shown in FIG. 6 or 9 determines whether the level of the input data DIN increases or decreases and outputs the second control signal C2 which, is the determination result to the fifth or seventh voltage transmitter 72 or 112, the sixth or eighth voltage transmitter 74 or 114, and the first or second voltage ladder 76 or 116 (step 130).

If the level of the input data DIN decreases, namely, if the input data DIN 100 shown in FIG. 8 transitions from the logic "high" level $V_{DD}$ to the logic "low" level $V_{SS}$, the level of the reference voltage $V_{SS}$ is determined to be the level of the third bus driving voltage (step 136). Here, the third bus driving voltage $V_{SS}$ having the determined level corresponding to the input data DIN 100 having the low level is transmitted to the bus receiving apparatus through the data bus (not shown) instead of the input data DIN of the logic "low" level.

However, if the level of the input data DIN 100 decreases, namely, if the input data DIN shown in FIG. 8 is transited from the logic "low" level $V_{SS}$ to the logic "high" level $V_{DD}$, the first or second voltage adder 76 or 116 adds a voltage whose level is higher than or equal to the second predetermined level $|V_{TP}|$ or $(N-5)*|V_{TP}|$ to the third bus driving voltage $V_{SS}$ transmitted through the data bus for the second predetermined time $t_{d2}$ or $t_{d2'}$ (step 132). After the step 132, the level of the voltage $|V_{TP}|+V_{SS}$ or$(N-5)*|V_{TP}|+V_{SS}$, which is higher than the reference voltage $V_{SS}$ transmitted from the fifth or seventh voltage transmitter 72 or 112 by the second predetermined level, is determined to be the level of the fourth bus driving voltage (step 134).

As a result, the level of the first bus driving voltage generated by the apparatus shown in FIG. 1 or FIG. 4 and the method according to the present invention shown in FIG. 5, which is performed by the apparatus, is equal to the level of the supply voltage $V_{DD}$. The level of the second bus driving voltage is obtained by reducing the level of the supply voltage $V_{DD}$ by the first predetermined level $V_{TN}$ or $(M-1)*V_{TN}$. However, the level of the third bus driving voltage generated by the apparatus shown in FIG. 6 or FIG. 9 and the method shown in FIG. 10, which is performed by the apparatus, is equal to the level of the reference voltage $V_{SS}$. The level of the fourth bus driving voltage is equal to $|V_{TP}|+V_{SS}$ or $(N-5)*|V_{TP}|+V_{SS}$.

Figure 11:
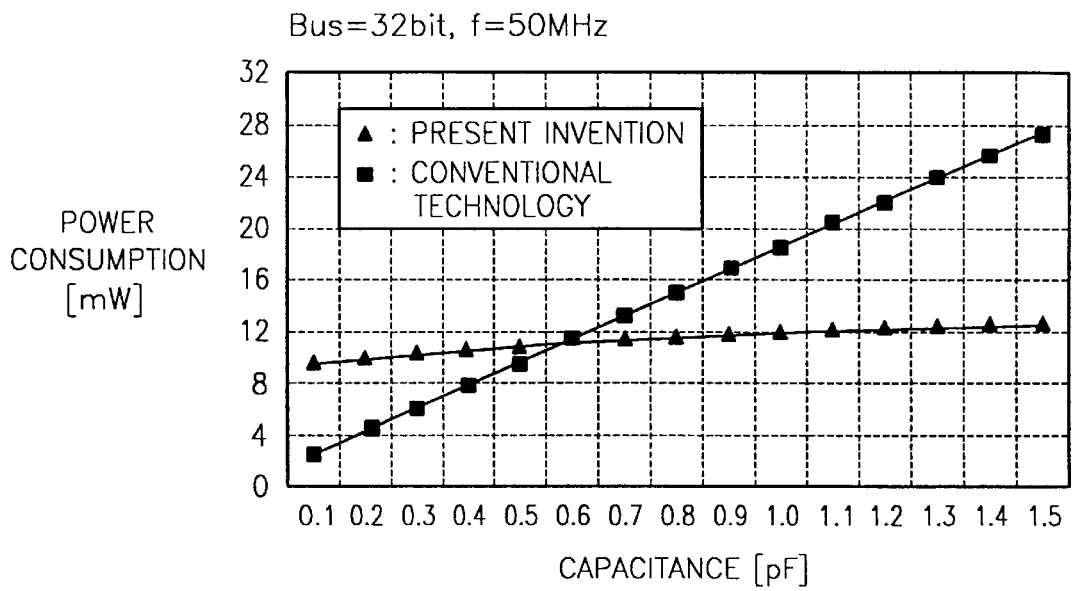
FIG. 11 is a graph comparing the amounts of power consumed by the respective integrated circuits in which the bus driving apparatus shown in FIG. 1 is used, according to the amount of change in the capacitance of a parasitic capacitor.

FIG. 11 is a graph comparing the amounts of power consumed by the respective integrated circuits in which the bus driving apparatus shown in FIG. 1 is used, according to the amount of change in the capacitance of a parasitic capacitor. The horizontal axis denotes the capacitance of the parasitic capacitor $C_W$ and the vertical axis denotes the power consumption by the integrated circuit.

As shown in FIG. 11, when an integrated circuit having a data bus transmits data through the data bus using the bus driving apparatus according to the present invention shown in FIG. 1, more power is consumed by the integrated circuit when a bus driving apparatus according to the present invention is used than when a conventional bus driving apparatus is used until the capacitance of the parasitic capacitor $C_W$ is 0.5 pF. This is because the bus driving apparatus according to the present invention is constituted of more transistors than the conventional bus driving apparatus. However, since the capacitance of the parasitic capacitor $C_W$, which increases as the length of the line of the data bus increases, generally has a value larger than 0.5 pF, much less power is consumed by the integrated circuit when the bus driving apparatus according to the present invention is used than when the conventional bus driving apparatus is used. For example, the power consumption of an integrated circuit which uses the bus driving apparatus according to the present invention is reduced by up to 35% when the capacitance of the parasitic capacitor $C_W$ is 1 pF and by up to, 55% when the capacitance of the parasitic capacitor $C_W$ is 1.5 pF.

Figure 12:
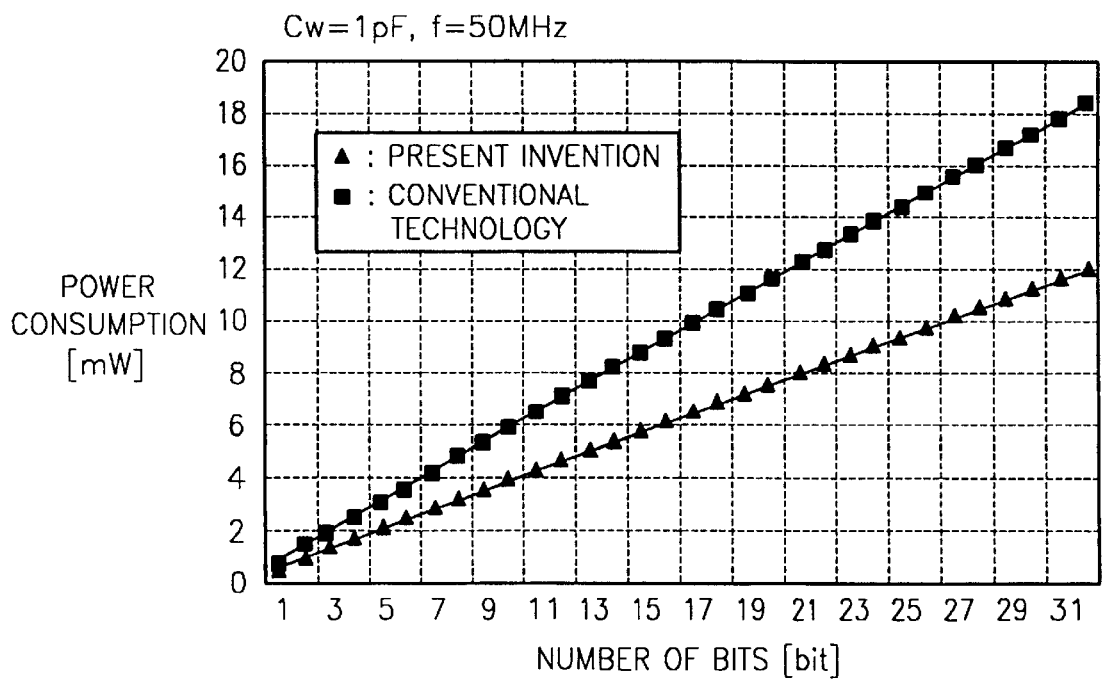
FIG. 12 is a graph comparing the amounts of power consumed by the respective integrated circuits in which the bus driving apparatus shown in FIG. 1 is used with each other, according to the amount of change in the number of bits of the data bus.

FIG. 12 is a graph comparing the amounts of power consumed by the respective integrated circuits in which the bus driving apparatus shown in FIG. 1 is used, according to the amount of change in the number of bits of the data bus. The horizontal axis denotes the number of bits and the vertical axis denotes the power consumption of the integrated circuit.

In general, when the capacitance of the parasitic capacitor $C_W$ is uniform, the power consumption of the integrated circuit increases as the number of bits of data bus increases. Referring to FIG. 12, the power consumption of an integrated circuit which uses a bus driving apparatus according to the present invention is reduced by 35% from the power consumption of the integrated circuit which uses a conventional bus driving apparatus.

Since the swing width of the bus driving voltage transmitted to the bus receiving apparatus through the data bus is $V_{DD}-V_{TN}-V_{SS}$, $V_{DD}-(M-1)*V_{TN}-V_{SS}$, $V_{DD}-|V_{TP}|-V_{SS}$, or $V_{DD}-(N-5)*|V_{TP}|-V_{SS}$ smaller than the swing width of the bus driving voltage output from the conventional bus driving apparatus, the amount of charge charged or discharged in the parasitic capacitor $C_W$ is small. Accordingly, it is possible to significantly reduce the power consumption by the integrated circuit.

In the drawings and specification, there have been disclosed typical preferred embodiments of the invention and, although specific terms are employed, they are used in a generic and descriptive sense only and not for purposes of limitation, the scope of the invention being set forth in the appended claims. Therefore, it will be understood by those skilled in the art that various changes in form and details may be made in the preferred embodiments without departing from the spirit and scope of the invention as defined by the appended claims.

What is claimed is:

1. An apparatus for driving a data bus, comprising:
   a first voltage transmitter for transmitting a first bus driving voltage to the data bus in response to a control signal, the first bus driving voltage corresponding to input data having a high level;
   a second voltage transmitter for transmitting a second bus driving voltage to the data bus in response to the control signal, the second bus driving voltage having a level that is lower than the level of the first bus driving voltage by a predetermined difference level and corresponding to a low level of the input data;
   a control signal generator for outputting the control signal in response to the input data; and
   a voltage reducer for reducing the first bus driving voltage transmitted to the data bus by a voltage having a level higher than or equal to the predetermined difference level in response to the input data and the control signal when the input data transitions from the high level to the low level.

2. The apparatus of claim 1, wherein the apparatus for driving the bus is included in an integrated circuit together with the data bus.

3. The apparatus of claim 1, wherein the first voltage transmitter comprises a first PMOS transistor having a gate connected to the control signal and a source and a drain connected to a supply voltage and the data bus, respectively.

4. The apparatus of claim 1, wherein the second voltage transmitter comprises a first NMOS transistor having a gate connected to the control signal and a drain and a source connected to a supply voltage and the data bus, respectively, wherein the predetermined difference level corresponds to the level of the gate-to-source threshold voltage of the first NMOS transistor.

5. The apparatus of claim 4, wherein the second voltage transmitter further comprises second through Mth (where M is a positive integer larger than or equal to 2) NMOS transistors, the drain and gate of each of the NMOS transistors being electrically connected to each other,
   wherein the second NMOS transistor comprises a drain connected to the source of the first NMOS transistor, an Xth (3≦X≦M−1) NMOS transistor comprises a drain and a source connected to the source of an (X−1)th NMOS transistor and the drain of an (X+1)th NMOS transistor, respectively, and the Mth NMOS transistor comprises a drain and a source connected to the source of the (M−1)th NMOS transistor and the data bus, respectively,
   and wherein the voltage having the predetermined difference level is obtained by adding the gate-to-source threshold voltages of the first through Mth NMOS transistors to each other.

6. The apparatus of claim 1, wherein the voltage reducer comprises:
   a delay for delaying the control signal for a predetermined time required for reducing the first bus driving voltage transmitted to the data bus by the voltage having the level higher than or equal to the predetermined difference level and outputting the delayed control signal;
   OR operation means for performing an OR operation on the delayed control signal obtained by the delay and the input data and outputting the OR operation result; and
   a second PMOS transistor having a gate connected to the OR operation result and a source and a drain connected to the data bus and a reference voltage, respectively.

7. An apparatus for driving a data bus, comprising:
   a first voltage transmitter for transmitting a first bus driving voltage to the data bus in response to a control signal, the first bus driving voltage corresponding to the input data having a low level;
   a second voltage transmitter for transmitting a second bus driving voltage to the data bus in response to the control signal, the second bus driving voltage having a level that is higher than the level of the first bus driving voltage by a predetermined difference level and corresponding to a high level of the input data;
   a control signal generator for outputting the control signal in response to the input data; and
   a voltage adder for adding a voltage having a level higher than or equal to the predetermined difference level to the first bus driving voltage transmitted to the data bus in response to the input data and the control signal when the input data transitions from the low level to the high level.

8. The apparatus of claim 7, wherein the apparatus for driving the bus is included in an integrated circuit together with the data bus.

9. The apparatus of claim 7, wherein the first voltage transmitter comprises a NMOS transistor having a gate connected to the control signal and a drain and a source connected to the data bus and a reference voltage, respectively.

10. The apparatus of claim 7, wherein the second voltage transmitter comprises a PMOS transistor having a gate connected to the control signal and a source and a drain connected to the data bus and a reference voltage, respectively,
    wherein the predetermined difference level corresponds to the level of the source-to-gate threshold voltage of the PMOS transistor.

11. The apparatus of claim 10, wherein the second voltage transmitter further comprises second through Mth (where M is a positive integer larger than or equal to 2) PMOS transistors, the drain and gate of each of the PMOS transistors being electrically connected to each other,
    wherein the second PMOS transistor comprises a drain connected to the source of the first PMOS transistor, an Xth (3≦X≦M−1) PMOS transistor comprises a source and a drain connected to the drain of a (X+1)th PMOS transistor and the source of a (X−1)th PMOS transistor, respectively, and the Mth PMOS transistor comprises a source and a drain connected to the data bus and the source of the (M−1)th PMOS transistor, respectively,
    and wherein the voltage having the predetermined difference level is obtained by adding the source-to-gate threshold voltages of the first through Mth PMOS transistors to each other.

12. The apparatus of claim 7, wherein the voltage adder comprises:
    a delay for delaying the control signal for a predetermined time required for adding the voltage having the level higher than or equal to the predetermined difference level to the bus driving voltage transmitted to the data bus and outputting the delayed control signal;
    AND operation means for performing an AND operation on the delayed control signal obtained by the delay and the input data and outputting the AND operation result; and a second NMOS transistor having a gate connected to the AND operation result and a drain and a source connected to a supply voltage and the data bus.

13. A method for driving a data bus, comprising:

defining first and second bus driving voltages associated with high and low levels of input data, respectively, for transmission to a bus receiving device through the data bus instead of the input data;

determining whether a level of the input data decreases or increases;

defining the level of the first bus driving voltage to be the level of a supply voltage when the level of the input data increases;

generating a reduced bus driving voltage level by reducing the level of the first bus driving voltage transmitted to the data bus by a level higher than or equal to a predetermined level when the level of the input data decreases; and defining the level of the second bus driving voltage to be the level lower than the level of the supply voltage by the predetermined level.

14. A method for driving a bus, comprising:

defining first and second bus driving voltages associated with high and low levels of input data, respectively, for transmission to a bus receiving device through the data bus instead of the input data;

determining whether a level of the input data decreases or increases;

defining the level of the first bus driving voltage to be a reference voltage when the level of the input data decreases;

generating an added bus driving voltage level by adding a level higher than or equal to a predetermined level to the first bus driving voltage transmitted to the data bus when the level of the input data increases; and defining the level of the second bus driving voltage to be the level higher than the level of the reference voltage by the predetermined level.

* * * * *